(12) United States Patent
Dirksen et al.

(10) Patent No.: US 10,293,375 B2
(45) Date of Patent: May 21, 2019

(54) CMUT DEVICE MANUFACTURING METHOD, CMUT DEVICE AND APPARATUS

(71) Applicant: KONINKLIJKE PHILIPS N.V., Eindhoven (NL)

(72) Inventors: Peter Dirksen, Eindhoven (NL); Marcel Mulder, Eindhoven (NL); Adriaan Leeuwestein, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 349 days.

(21) Appl. No.: 15/021,962

(22) PCT Filed: Sep. 15, 2014

(86) PCT No.: PCT/EP2014/069574
§ 371 (c)(1),
(2) Date: Mar. 15, 2016

(87) PCT Pub. No.: WO2015/043989
PCT Pub. Date: Apr. 2, 2015

(65) Prior Publication Data
US 2016/0228915 A1 Aug. 11, 2016

(30) Foreign Application Priority Data

Sep. 24, 2013 (EP) ..................... 13185792

(51) Int. Cl.
*B06B 1/02* (2006.01)
*H02N 1/08* (2006.01)
(Continued)

(52) U.S. Cl.
CPC .......... *B06B 1/0292* (2013.01); *B81B 3/0021* (2013.01); *B81C 1/00158* (2013.01);
(Continued)

(58) Field of Classification Search
CPC ..... H01L 29/84; B81B 3/0086; B81B 3/0021; B81B 3/0027; B06B 1/0292; H02N 1/006; H02N 1/08
See application file for complete search history.

(56) References Cited

U.S. PATENT DOCUMENTS 7,615,834 B2 11/2009 Khuri-Yakub et al.
8,309,428 B2 11/2012 Lemmerhirt et al.
(Continued)

FOREIGN PATENT DOCUMENTS

CN 101712028 A 5/2010
EP 2508269 A2 10/2012

OTHER PUBLICATIONS

Ergun et al "Capacitive Micromachined Ultrasonic Transducers: Fabrication Technology" IEEE Transactions on Ultrasonics Ferroelectrics and Frequency Control vol. 52, No. 12, Dec. 2005, p. 2242-2258.
(Continued)

*Primary Examiner* — Edgardo San Martin

(57) ABSTRACT

Disclosed is a method of manufacturing a capacitive micromachined ultrasonic transducer (CMUT) device comprising a first electrode (112) on a substrate (110) and a second electrode (122) embedded in an electrically insulating membrane, the first electrode and the membrane being separated by a cavity (130) formed by the removal of a sacrificial material (116) in between the first electrode and the membrane, the method comprising forming a membrane portion (22) on the second electrode and a further membrane portion (24) extending from the membrane portion towards the substrate alongside the sacrificial material, wherein the respective thicknesses the membrane portion and the further membrane portion exceed the thickness of the sacrificial material prior to forming said cavity. A CMUT device
(Continued)

manufactured in accordance with this method and an apparatus comprising such a CMUT device are also disclosed.

14 Claims, 13 Drawing Sheets

(51) Int. Cl.
  *B81B 3/00* (2006.01)
  *B81C 1/00* (2006.01)
  *H02N 1/00* (2006.01)
(52) U.S. Cl.
  CPC ...... *H02N 1/006* (2013.01); *B81B 2203/0127* (2013.01); *B81B 2203/0315* (2013.01); *B81C 2201/013* (2013.01); *B81C 2201/0109* (2013.01)

(56) References Cited

U.S. PATENT DOCUMENTS

| | | | | |
|---|---|---|---|---|
| 8,760,974 | B2* | 6/2014 | Tanaka | G10K 9/121 367/174 |
| 9,132,693 | B2* | 9/2015 | Klootwijk | B06B 1/0292 |
| 9,231,496 | B2* | 1/2016 | Dirksen | B06B 1/0292 |
| 9,497,552 | B2* | 11/2016 | Akiyama | H04R 19/013 |
| 9,539,854 | B2* | 1/2017 | Klootwijk | B06B 1/0292 |
| 9,607,606 | B2* | 3/2017 | Klootwijk | B06B 1/0292 |
| 9,828,236 | B2* | 11/2017 | Dirksen | B81B 3/0086 |
| 9,834,434 | B2* | 12/2017 | Kato | B81B 7/0041 |
| 2005/0177045 | A1 | 8/2005 | Degertekin | |
| 2009/0250729 | A1 | 10/2009 | Lemmerhirt et al. | |
| 2010/0256498 | A1* | 10/2010 | Tanaka | B06B 1/0215 600/459 |
| 2011/0198966 | A1 | 8/2011 | Fjuii et al. | |
| 2011/0316383 | A1* | 12/2011 | Machida | B06B 1/0292 310/300 |
| 2013/0069480 | A1 | 3/2013 | Akiyama et al. | |
| 2015/0366539 | A1* | 12/2015 | Hasegawa | B06B 1/0292 600/459 |
| 2016/0091344 | A1* | 3/2016 | Hasegawa | B06B 1/0292 73/658 |
| 2016/0153939 | A1* | 6/2016 | Kato | G01N 29/2406 73/606 |
| 2018/0044172 | A1* | 2/2018 | Kato | B81C 1/00182 |

OTHER PUBLICATIONS

Khuri-Yakub "Sacrificial Etch Fabrication Process for CMUTS" www-kyg.stanford.edu/khuriyakub/opencms/en/research/fabrication_and_packaging/Surface_Micromachining/index.html.

Knight et al "Low Temperature Fabrication of Immersion Capacitive Micromachined Ultrasonics Transducers on. . ." IEEE Transactions on Ultrasonics, Ferroelectrics, and Frequency Control Vo. 51, No. 10, Oct. 2004 p. 1324-1333.

Park et al "Fabricating Capacitive Micromachined Ultrasonic Transducers With Direct Wafer-Bonding and Locos Technology" MEMS 2008, Tuscon, AZ, Jan. 13-17, 2008.

Wang et al, "Design and Test of Monolithic Ultrasound-Image Guided Hifu Device Using Annular CMUT Rings" 2008 IEEE International Symposium Proceedings , p. 459-462.

* cited by examiner (a)

$$h \sim R \cdot \frac{S}{E} \cdot \frac{t}{w} \left\{ 3\left(\frac{g}{t}+\frac{1}{2}\right)^2 \left(\frac{t}{w}\right)^2 + \left(\frac{g}{t}+\frac{1}{2}\right)\left(\frac{g}{t}+1\right) \right\}$$

(b)

(a)

(b)

CMUT DEVICE MANUFACTURING METHOD, CMUT DEVICE AND APPARATUS

This application is the U.S. National Phase application under 35 U.S.C. § 371 of International Application No. PCT/EP2014/069574, filed on Sep. 15, 2014, which claims the benefit of EP Application No. 13185792.2 filed Sep. 24, 2013. These applications are hereby incorporated by reference herein.

FIELD OF THE INVENTION

The present invention relates to a method of manufacturing a capacitive micro-machined ultrasonic transducer (CMUT) device comprising a first electrode on a substrate and a second electrode embedded in an electrically insulating membrane, the first electrode and the membrane being separated by a cavity formed by the removal of a sacrificial material in between the first electrode and the membrane.

The present invention further relates to a CMUT device comprising a first electrode on a substrate and a second electrode embedded in an electrically insulating membrane, the first electrode and the membrane being separated by a cavity.

The present invention yet further relates to an apparatus comprising such a CMUT device.

BACKGROUND OF THE INVENTION

Capacitive micro-machined ultrasonic transducer (CMUT) devices are rapidly becoming the default choice as the sensors in a range of sensing apparatuses such as imaging apparatuses. This is because CMUT devices can offer excellent bandwidth and acoustic impedance characteristics, which makes them the preferable over e.g. piezoelectric transducers.

Vibration of the CMUT membrane can be triggered by applying pressure (for example using ultrasound) or can be induced electrically. Electrical connection to the CMUT device, often by means of an integrated circuit (IC) such as an application specific integrated circuit (ASIC) facilitates both transmission and reception modes of the device. In reception mode, changes in the membrane position cause changes in electrical capacitance, which can be registered electronically. In transmission mode, applying an electrical signal causes vibration of the membrane.

CMUT devices generally operate with a biasing voltage applied. The CMUT can be operated in so called collapsed mode where the biasing voltage applied is increased above the collapse voltage to restrict the membrane and confine part of it against the substrate. The frequency of operation of the CMUT device is characterised by the material and physical properties of the membrane, such as the stiffness, and the size of the cavity. The bias voltage and application of the CMUT device also influence the operation mode. A CMUT device is often used in apparatuses for ultrasound imaging applications and in other applications where the CMUT device is used to detect fluid or air pressures. A pressure causes a deflection of the membrane that is electronically sensed as a change of capacitance. A pressure reading can then be derived.

The manufacturing of CMUT devices that meet design specifications is a non-trivial exercise. In order to obtain cost-effective devices, it is for instance desirable to manufacture the CMUT devices in existing manufacturing technologies. CMOS is a non-limiting example of such a technology. U.S. Pat. No. 8,309,428 B2 for instance discloses a CMOS manufacturing method of such a device.

However, it proves to be difficult to obtain high yields of acceptable CMUT devices from wafers manufactured in such technologies. It has been found by the present inventors that over the wafer, a substantial number of the manufactured CMUT devices suffer from membrane warping, which renders the device non-functional. This problem for instance occurs if the devices are manufactured in accordance with the teachings of e.g. US 2013/0069480 A1.

SUMMARY OF THE INVENTION

The present invention seeks to provide a manufacturing method of a CMUT device that improves the yield of the manufacturing process.

The present invention further seeks to provide a wafer obtainable by this manufacturing process.

The present invention yet further seeks to provide a CMUT device obtainable by this manufacturing process.

The present invention yet further seeks to provide an apparatus comprising such a CMUT device.

According to an aspect, there is provided a method of manufacturing a capacitive micro-machined ultrasonic transducer (CMUT) device comprising a first electrode on a substrate and a second electrode embedded in an electrically insulating membrane, the first electrode and the membrane being separated by a cavity formed by the removal of a sacrificial material in between the first electrode and the membrane, the method comprising forming a membrane portion on the second electrode and a further membrane portion extending from the membrane portion towards the substrate alongside the sacrificial material, wherein the respective thicknesses the membrane portion and the further membrane portion exceed the thickness of the sacrificial material prior to forming said cavity.

The present inventors have surprisingly found that the high number of non-functional CMUT devices and/or CMUT devices operating outside design tolerances resulting from such a manufacturing process is caused by the fact that in state of the art manufacturing processes, the membrane is finalized after the release of the cavity, e.g. when access to the cavity is sealed by a suitable sealing material, such as an electrically insulating (dielectric) material also used to form the membrane. Such a process is for instance disclosed in US 2013/0069480 A1. Although such a process is attractive because the sealing of the cavity and the completion of the membrane can be achieved by a single deposition step, it has been realized by the present inventors that when sealing the cavity whilst the membrane is relatively thin, this results in a relatively large number of CMUT devices with deformed membranes on the completed wafer. It has been found that the reason for this is that such a sealing step is typically performed at elevated temperatures, e.g. around 400° C., where the difference in thermal expansion coefficients of the second electrode and the membrane dielectric material can cause excessive stress in the membrane, resulting in the warping or buckling of the membrane. This yield can be dramatically improved by insuring that the thickness of the membrane over the second electrode exceeds the thickness of the sacrificial material prior to forming the cavity.

It is noted that U.S. Pat. No. 8,309,428 B2 discloses a CMOS manufacturing process of a CMUT device in which a protective layer is formed over the upper electrode prior to the removal of the sacrificial layer. However, this protective layer is for protecting the electrode from contamination and this citation is entirely silent about the thickness of this protective layer and its effect on the prevention of membrane deformation during the cavity formation.

In an embodiment, the thickness of the further membrane portion exceeds the thickness of the membrane portion. This further improves the robustness of the membrane during the cavity formation step, which further improves the yield of the manufacturing process.

The thickness of the membrane portion may be at least five times or even ten times the thickness of the sacrificial material, as at these thicknesses the desired membrane robustness is achieved during formation of the cavity. A thickness for the membrane portion of at least ten times the thickness of the sacrificial material is preferred for larger cavities, e.g. CMUT devices having a cavity diameter of at least 100 micron.

In an embodiment, the step of removing the sacrificial layer portion comprises creating an access to the sacrificial layer portion, and wherein the method further comprises sealing said access after forming said cavity, said sealing step including forming a sealing portion on the membrane portion and the further membrane portion. This further increases the thickness of the membrane and the robustness of the final device. This is for instance particularly advantageous for CMUT devices having membrane diameters in the micron domain, e.g., membrane diameters of 50 microns or more.

In an alternative embodiment, the method further comprises forming an etch stop layer on the membrane portion prior to said sealing step, etching the sealing portion from the membrane portion, said etching step terminating on the etch stop layer; and removing the etch stop layer after said etching step.

The etch stop layer may be dimensioned such that upon completion of the etching step, a ring of the sealing portion remains on the further membrane portion. It has been found that such a ring further strengthens the membrane without significantly affecting its flexibility.

In an embodiment, the membrane is formed at least in part by forming a first dielectric material layer over the sacrificial material; forming the second electrode on the first dielectric material; and forming the membrane portion on the second electrode, wherein the membrane portion is a second dielectric material layer. The dielectric material may be silicon nitride or any other suitable dielectric material.

A wafer may be provided comprising a plurality of CMUT devices obtained by the method according to an embodiment of the present invention. Such a wafer benefits from the fact that a much higher yield of acceptable CMUT devices is retrieved from the wafer.

According to another aspect, these is provided a capacitive micro-machined ultrasonic transducer (CMUT) device comprising a first electrode on a substrate and a second electrode embedded in an electrically insulating membrane, the first electrode and the membrane being separated by a cavity, wherein the membrane comprises a single layer membrane portion on the second electrode and a further membrane portion extending from the single layer membrane portion towards the substrate alongside the cavity, wherein the single layer membrane portion and the further membrane portion each have a thickness exceeding the height of the cavity, said thickness being at least five times and preferably ten times the height of the cavity. Such a device benefits from being cost-effective as it can be made in high yields whilst at the same time displaying excellent bandwidth and acoustic impedance characteristics.

In an embodiment, the thickness of said further membrane portion exceeds the thickness of the single layer membrane portion. This further improves the robustness of the CMUT device.

In an embodiment, the CMUT device further comprises a ring of an electrically insulating material on the further membrane portion, wherein said single layer membrane portion is at least partially exposed inside said ring. This increases the strength of the membrane without significantly affecting its dynamic properties.

In an embodiment, the CMUT device further comprises a protrusion of a sealing material extending from the cavity. In this embodiment, the protrusion seals the cavity without adding to the overall thickness of the membrane over the second electrode.

The CMUT device may be obtained by the method according to an embodiment of the present invention.

In accordance with another aspect, there is provided an apparatus comprising the CMUT device according to an embodiment of the present invention. Such a device may for instance be an ultrasound imaging device or a pressure sensing device.

BRIEF DESCRIPTION OF THE DRAWINGS

Embodiments of the invention are described in more detail and by way of non-limiting examples with reference to the accompanying drawings, wherein FIG. 1 schematically depicts a prior art CMUT device.

DETAILED DESCRIPTION OF THE EMBODIMENTS

Figure 1:
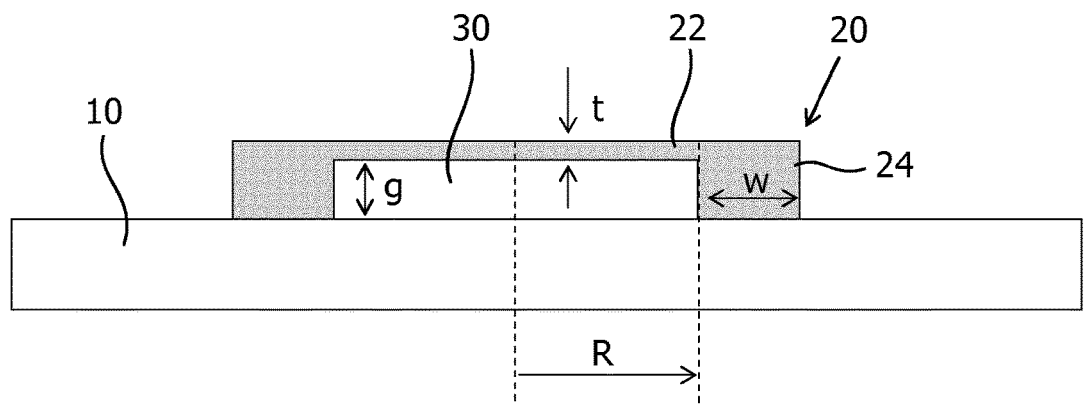

It should be understood that the Figures are merely schematic and are not drawn to scale. It should also be understood that the same reference numerals are used throughout the Figures to indicate the same or similar parts.

FIG. 1 schematically depicts the typical structure of a CMUT device. The CMUT device comprises a substrate 10 onto which a first electrode (not shown for the sake of clarity) is formed inside a cavity 30. The cavity 30 is delimited by a membrane 20 comprising a second electrode (not shown for the sake of clarity) embedded in the membrane 20. The membrane 20 typically comprises a first portion 22 over the cavity 30 and a second portion 24 extending from the first portion 22 towards the substrate 10, which acts as the wall of the cavity 30.

The cavity 30 may have a diameter 2R, i.e. a radius R and a height g. The first membrane portion 22 has a thickness t, whereas the second membrane portion 24 has a thickness w. Typical dimensions of a completed CMUT device are g~0.25 μm, t~0.5-4 μm, w~t and R~15-150 μm. However, prior to the release of the cavity 30, the thickness t (and w) is typically much smaller, as the membrane 20 is typically completed whilst at the same time sealing the access, e.g. via, through which the cavity 30 is released, as previously explained. It should be understood that FIG. 1 is drawn in a simplified and schematic fashion. For instance, it should be understood that the one or more layers forming the membrane 20 typically extend over the substrate 10, as will also be apparent from subsequent figures. Such extended layers have been omitted from FIG. 1 for the sake of clarity only.

Figure 2:
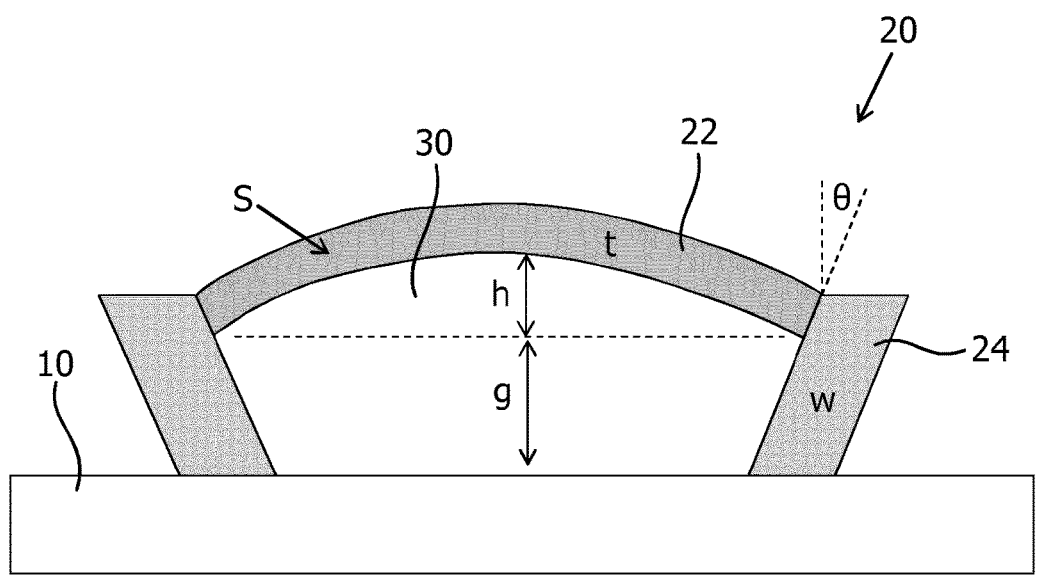
FIG. 2 schematically depicts unwanted deformation of the membrane of the prior art CMUT device of FIG. 1.

During the sacrificial etch that releases the cavity 30, the CMUT device is exposed to temperatures of up to 400° C. It has been realized by the present inventors that the difference between the thermal expansion coefficients of the second electrode material and the material(s) of the membrane 20 cause stresses in the membrane 20 that can lead to the deformation of the membrane 20 as is shown in FIG. 2. The stress on the membrane 20 can cause the first portion 22 to be pushed out of the horizontal plane by a distance h and the second portion (i.e. wall section) 24 to be pushed out of the vertical plane by an angle θ. It has been found that this deformation is the main reason for the low yield in typical state of the art CMUT device manufacturing processes in which a relatively thin membrane is present over the sacrificial material during the removal of this sacrificial material to form (release) the cavity 30.

The amount of deformation may be modelled using the following analytical expression derived by the present inventors:

$$h \sim R \cdot \frac{S}{E} \cdot \frac{t}{w} \left\{ 3\left(\frac{g}{t} + \frac{1}{2}\right)^2 \left(\frac{t}{w}\right)^2 + \left(\frac{g}{t} + \frac{1}{2}\right)\left(\frac{g}{t} + 1\right) \right\} \quad (1)$$

In this expression, S is the stress in the membrane (in MPa) and E is the Young's modulus, which has a typical value in the range of 50-250 GPa. The force on the second portion 24 resulting from the out-of-plane deformation of the first portion 22 causes a rhombus-type deformation of the second portion 24 as shown in FIG. 2.

Figure 3:
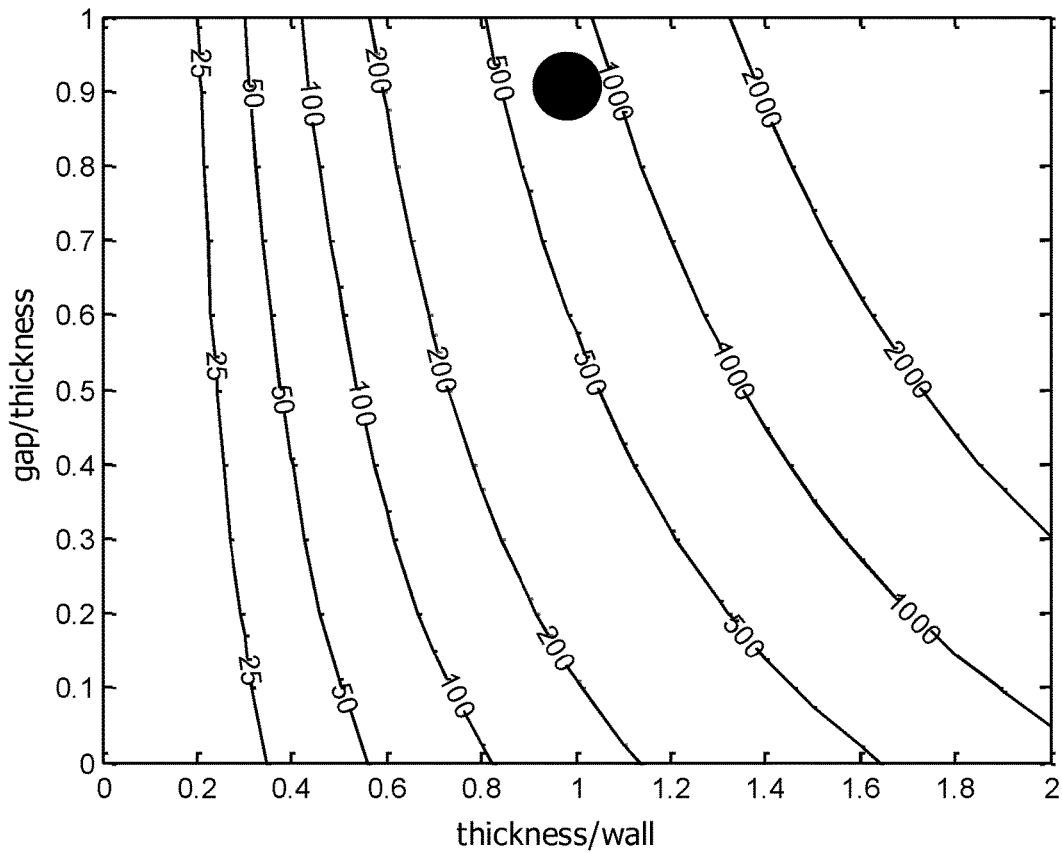
FIG. 3 shows the stress sensitivity of the prior art CMUT device of FIG. 1 in a stress sensitivity plot.

The analytical equation (1) can be used to calculate a deformation plot for the first membrane portion 22 as a function of the ratio t/w (x-axis) and g/t (y-axis). Such a plot is shown in FIG. 3. The black dot in this plot shows the typical out-of-plane bending h of the first membrane portion 22 of a typical prior art CMUT device having a thin membrane 20 during the release of the cavity 30, i.e. g/t~1. The deformation h is also correlated to the relative position of the CMUT device on the wafer, with the membranes of the devices at the wafer periphery being more prone to such deformations than the devices centrally positioned on the wafer. This is for instance caused by wafer location dependent non-uniformities introduced by the deposition tool used for the formation of the membrane 20. This will be demonstrated in more detail below.

In some application domains, e.g. low-frequency application domains, there is a need to increase the radius R of the cavities 30. It can be seen that this problem will exacerbate for larger CMUT devices, i.e. CMUT devices having a larger R, as the amount of out-of-plane bending h scales linearly with the radius R. As can be seen from the inventive analytical expression, the amount of out-of-plane bending of the first membrane portion 22 can be reduced by reducing the ratio g/t and/or the ratio t/w. Embodiments of the present invention provide CMUT device manufacturing methods in which at least one of these ratios is reduced in order to improve the yield of the CMUT device manufacturing process.

Figure 4:
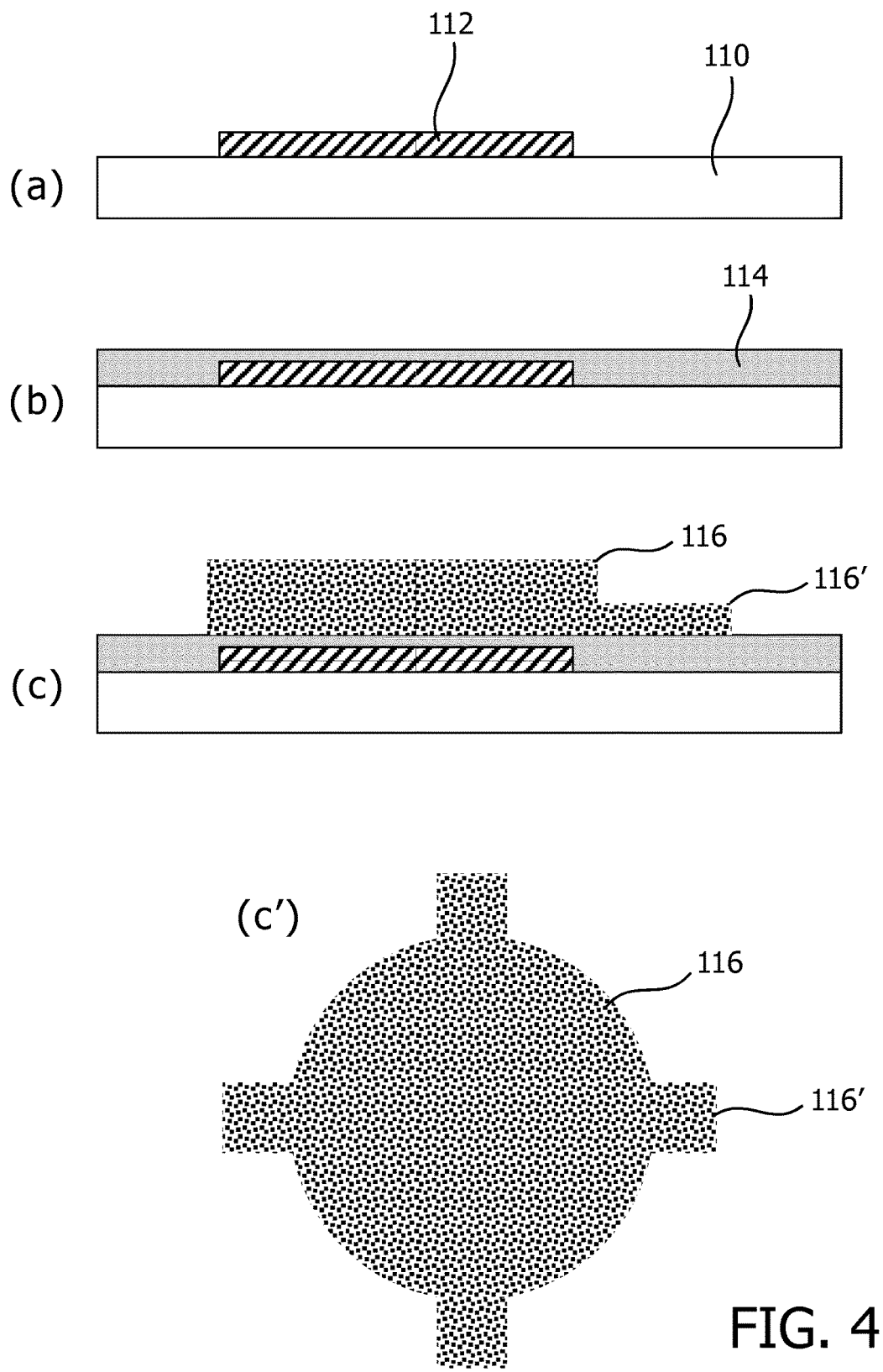
FIG. 4 schematically depicts the various processing steps for manufacturing a CMUT device in accordance with an embodiment of the present invention.
Figure 4:
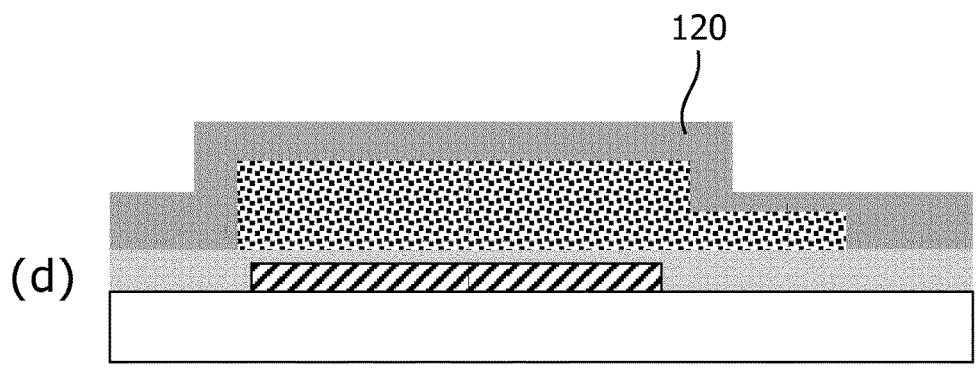
Figure 4:
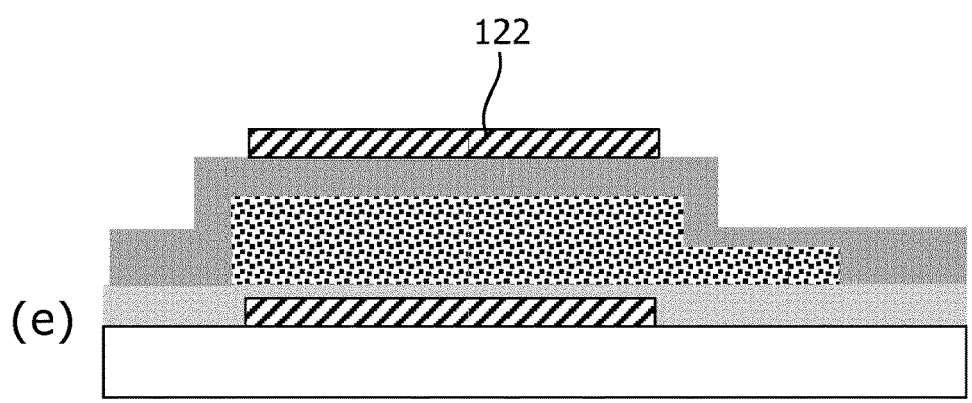
Figure 4:
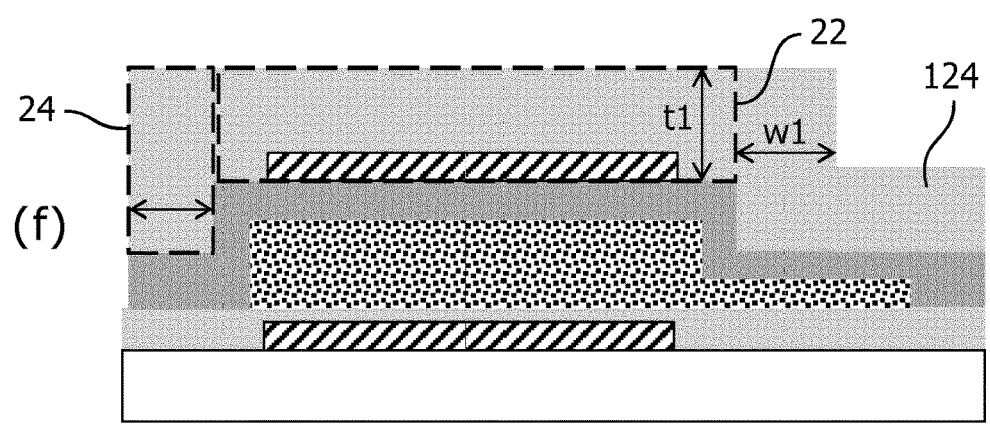
Figure 4:
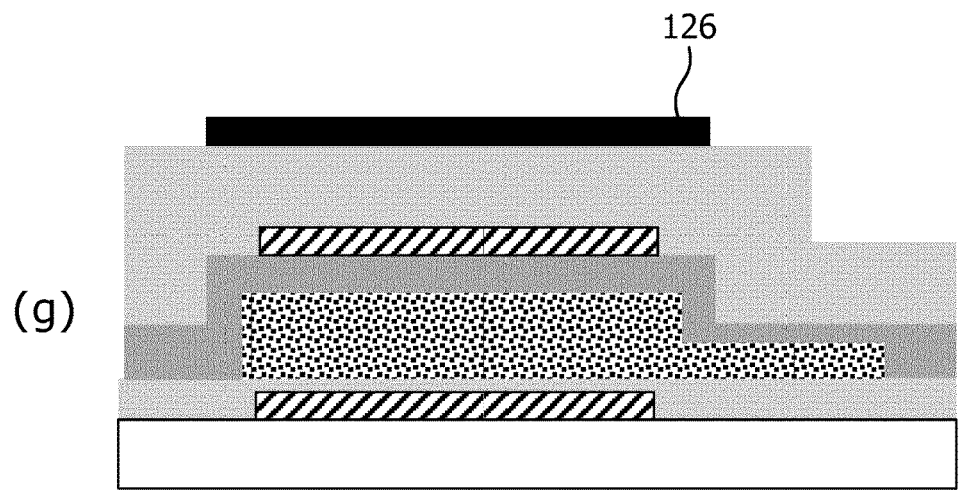
Figure 4:
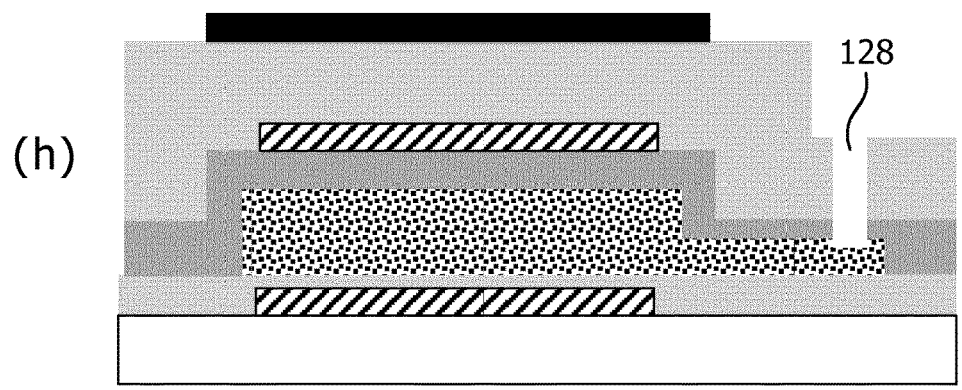
Figure 4:
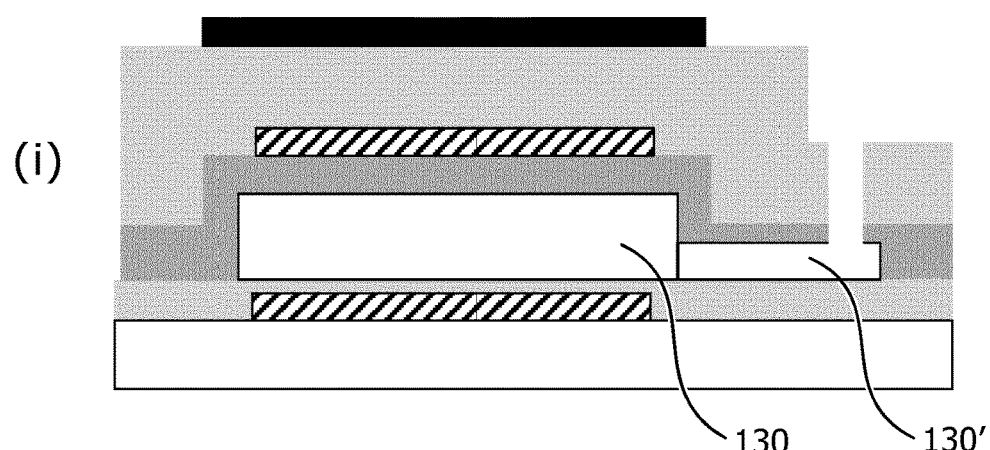
Figure 4:
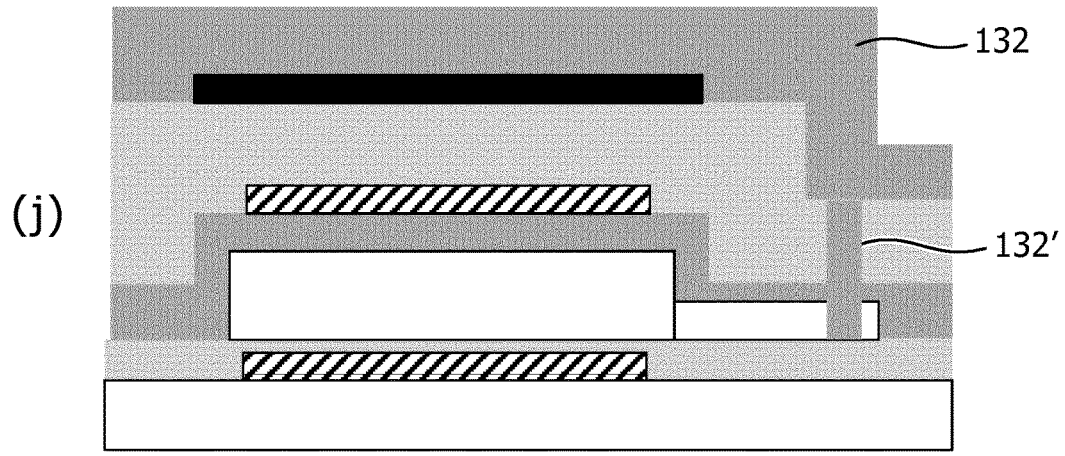
Figure 4:
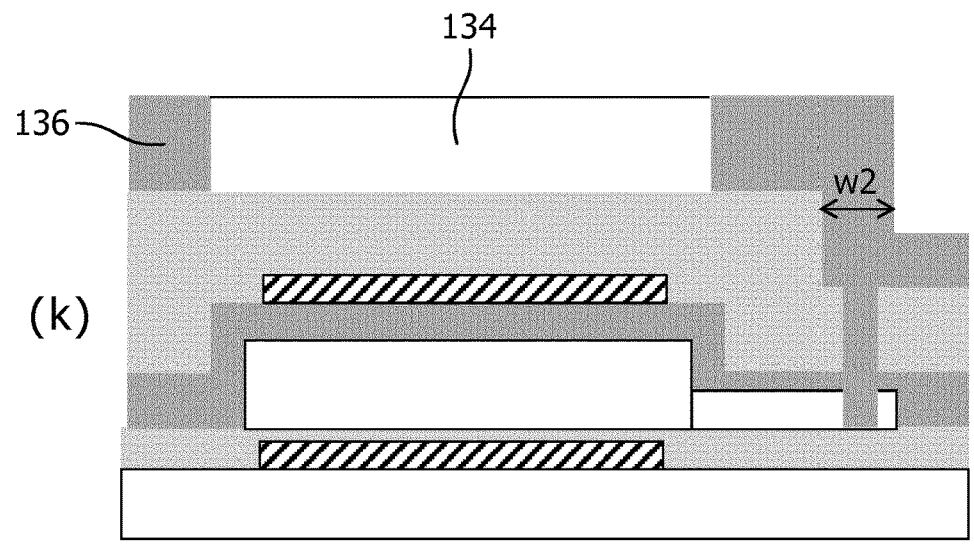

FIG. 4 schematically depicts an embodiment of a CMUT manufacturing method. The method proceeds in step (a) with the provision of a substrate 110, which may be any suitable substrate such as a silicon substrate, a silicon-on-insulator substrate, a silicon germanium substrate, a gallium nitride substrate and so on. A silicon-based substrate may for instance be used in a CMOS manufacturing process. A first electrode 112 is formed on the substrate 110, which electrode may be formed from any suitable electrically conductive material, e.g. metals or metal alloys. It is for instance particularly advantageous to use metals that are readily available in the manufacturing technology of choice, as this requires minimal redesign of the manufacturing flow, which is attractive from a cost perspective. For example, in a CMOS process, conductive materials such as Al, W, Cu, Ti, TiN and so on, as well as combinations of such materials, may be used to form the first electrode 112. In an embodiment, the first electrode 112 is selected from Al, an AlNd alloy or an Al/Mo layer stack. As the formation of such an electrode is well-known per se, this will not be explained in further detail for the sake of brevity.

The first electrode 112 and the substrate 110 may subsequently optionally be covered by an electrically insulating material layer 114. This is shown in step (b). Electrically insulating layers will also be referred to as dielectric layers in the present application. Such a dielectric layer 114 for instance may be used to electrically insulate the first electrode 112 from its counter electrode (see below) to prevent short-circuits between the electrodes during the operation of the CMUT device. In addition, the dielectric layer 114 may be used to protect the first electrode 112 and the substrate 110 from damage during the removal of the sacrificial material to form the cavity over the first electrode 112.

Although the dielectric layer 114 is shown to cover the entire substrate surface 110, it is equally feasible to provide a patterned dielectric layer 114 in which only certain parts of the substrate 110 together with the first electrode 112 are covered by the dielectric layer 114. Any suitable dielectric material may be used for the protection of the first electrode 112 and the substrate 110. In an embodiment, the dielectric layer 114 is a silicon oxide such as TEOS or the like although any suitable dielectric material may be used for the dielectric layer 114. As such a dielectric layer 114 may be formed in any suitable manner, e.g. using suitable deposition techniques such as CVD and PECVD, its formation will not be explained in further detail for the sake of brevity.

In step (c), a sacrificial material is formed, e.g. through a suitable deposition technique, on the dielectric layer 114.

The sacrificial material is patterned to form a first portion 116 from which the cavity is formed and may further comprise a second portion 116' acting as a channel through which the sacrificial material is removed.

The height of the first portion 116 and the second portion 116' of the sacrificial material corresponding to the gap height g as shown in FIG. 1 of the cavity to be formed is typically in the range of 100-1,000 nm although it should be understood that values outside this range may also be contemplated.

In an embodiment, the first portion 116 is deposited as a circular portion having a few teeth-like protrusions as the second portion 116', e.g. 2-8 of such protrusions. A top-view of such a sacrificial material portion is shown in step (c'), in which four of such protrusions are shown by way of non-limiting example only. The teeth-like second portions 116' are typically used as cavity access platforms outside the membrane to be formed through which access to the first portion 116 can be provided for opening or releasing the cavity. It should be understood that the first portion 116 and the second portion 116' are typically formed to the same thickness or height, with the membrane to be formed extending towards the substrate 110 in between the teeth-like second portions 116'. In the various drawings of the present application, the second portions 116' are shown to have a different thickness in order to indicate this aspect, i.e. the aspect that the membrane of the CMUT device extends towards the substrate 110 in between the teeth-like second portions 116'. This should not be construed as the first portion 116 and the second portion 116' having different thicknesses in reality.

In principle, any suitable sacrificial material may be used, although for device performance reasons it is preferable to use sacrificial materials that can be effectively removed in a subsequent etching step. For instance, the use of metals such as Al, Cr and Mo or non-metals such as amorphous silicon or silicon oxide may be contemplated. Materials such as Al, amorphous silicon and silicon oxide are for instance readily available in CMOS processes, and of these materials Al can be particularly effectively removed by etching. The patterned sacrificial material may be formed in any suitable manner, e.g. using suitable deposition and patterning techniques and its formation will not be explained in further detail for the sake of brevity.

It will be understood that the diameter of the first portion 116 defines the diameter of the cavity of the CMUT device to be formed. In an embodiment, the diameter is selected in a range of 20-500 micron, more preferably in a range of 50-300 micron, although it should be understood that larger diameters may also be contemplated, e.g. diameters up to 1,000 micron.

In step (d), a first dielectric layer 120 of the membrane to be formed is deposited over the first portion 116 and the second portion 116' of the sacrificial material and the exposed portions of the dielectric layer 114. As the first dielectric layer 120 and the dielectric layer 114 are both exposed to the etch recipe for removing the sacrificial layer, the first dielectric layer 120 and the dielectric layer 114 may be of the same material, although it is of course also plausible to use different materials for the first dielectric layer 120 and the dielectric layer 114 respectively. In an embodiment, the first dielectric layer 120 and the dielectric layer 114 each comprise a silicon oxide layer such as a TEOS layer or the like. The first dielectric layer 120 may be formed as a layer stack, e.g. an oxide-nitride stack or an oxide-nitride-oxide stack. Similarly, the dielectric layer 114 may be formed as such a stack. It is reiterated that any suitable dielectric material may be used for the dielectric layer 114 and the first dielectric layer 120.

Next, the second electrode 122 is formed on the first dielectric layer 120 as shown in step (e) such that the second electrode 122 is oriented opposite the first electrode 112. The second electrode 122 preferably is formed of the same electrically conductive material as the first electrode 112, although it should be understood that the second electrode 122 and the first electrode 112 alternatively may be formed of different materials. The second electrode 122 may for instance be formed from any suitable electrically conductive material such as Al, W, Cu, Ti, TiN and so on, as well as combinations of such materials. In an embodiment, the second electrode 122 is selected from Al, an AlNd alloy or an Al/Mo layer stack. The second electrode 122 may be formed using well-known techniques that are not further explained for the sake of brevity only. The first electrode 112 and the second electrode 122 may be formed to any suitable thickness, e.g. 200-700 nm thickness.

In step (f), a second dielectric layer 124 of the membrane to be formed is formed over the second electrode 122 and the first dielectric layer 120. The second dielectric layer typically comprises a first portion 22 over the second electrode and a second portion 24 extending from the first portion 22 towards the substrate 10 alongside the first portion 116 of the sacrificial material and in between (and over) the second portions 116' of the sacrificial material as previously explained. The first portion 22 has an initial thickness t1 and the second portion has an initial thickness w1, with w1 and t1 typically being (approximately) equal. For the avoidance of doubt, t1 corresponds to t and w1 corresponds to w in FIG. 1. In accordance with an embodiment of the present invention, t1 is chosen to be larger than the height of the first portion 116 in order to reduce the ratio t/g previously described with the aid of FIG. 1. In a preferred embodiment, the ratio t/g is chosen in the range 4-20, more preferably in the range of 5-10 in order to provide the membrane the desired robustness during the formation of the cavity. For instance, the height g of the sacrificial portion 116 may be in the range of 100-700 nm with the thickness of the first portion 22 selected in the range of 0.5-10 micron, with the first portion 22 being at least five times as thick as the sacrificial portion 116.

The second dielectric layer 124 may be made of the same material as at least the upper layer of the first dielectric layer stack 120 and may generally be made of any suitable electrically insulating material, e.g. silicon oxide, silicon nitride and it is of course equally feasible that the second dielectric layer 124 is made of a different material than the first dielectric layer 120. However, in this case, care should be taken that the respective thermal expansion coefficients of the different materials are similar or identical to avoid the build-up of thermally induced stress between these layers at the temperatures at which the sacrificial material is removed to form the cavity. As before, the second dielectric layer 124 may be formed in any suitable manner.

In step (g), an etch stop layer 126 is formed over the first portion 22 of the second dielectric layer 124 after which an access or via 128 is formed through the first dielectric layer 120 and the second dielectric layer 124 to provide access to the second portion 116' of the sacrificial material. This is shown in step (h). The access or via typically lands on one of the teeth-like second portions 116' of the sacrificial material outside the perimeter of the membrane as previously explained. The formation of such an access or via 128 is well-known per se and will not be explained in further detail for the sake of brevity only.

Next, the first portion 116 and the second portions 116' of the sacrificial material are removed in step (i) through the access or via 128 using a suitable etch recipe to form the cavity 130 in between the first electrode 112 and the second electrode 122 embedded in between the first dielectric layer 120 and the second dielectric layer 124 of the membrane of the CMUT device. Suitable etch recipes for such conventional sacrificial materials are well-known per se and the skilled person will have no difficulty selecting an appropriate etch recipe using his common general knowledge.

The access or via 128 is subsequently sealed in step (j) using a suitable sealing material, e.g. a suitable further dielectric material, thereby yielding a further dielectric material layer 132 over the etch stop layer 126 and the second dielectric layer 124 as well as a sealing plug 132' in the access or via 128. In an embodiment, the minimum thickness of the further dielectric material layer 132 is two times the height g of the cavity 130 to ensure effective sealing of the access or via 128. The further dielectric material may be any suitable dielectric material that may be deposited in any suitable manner, as is well-known per se. In an embodiment, the further dielectric material is the same material as the material of the second dielectric layer 124, e.g. silicon oxide or silicon nitride. The formation of the further dielectric material layer 132 increases the thickness of the wall portion of the cavity defined by the second portion 24 to w1+w2 as is shown in step (j). For the avoidance of doubt it is noted that w1+w2 correspond to w in FIG. 1.

In order to reduce the ratio t/w of the CMUT device, in step (k) the part of the further dielectric material layer 132 over the first portion 22 is selectively removed using a suitable etch recipe, e.g. an isotropic dry etch recipe, whilst stopping on the etch stop layer 126. At this point, it should be apparent that the material of the etch stop layer is selected such that it is highly resistant to the etch recipe used to remove the selected portion of the further dielectric material layer 132. Such materials are known per se and it therefore suffices to say that any suitable etch stop material 126 may be selected and deposited and patterned in any suitable manner.

In step (k), the etch stop layer is subsequently removed to form an opening 134, e.g. through etching to yield a CMUT device having a membrane in which the thickness of the first portion 22 over the second electrode 122 is t1 and the thickness of the second portion 24 alongside the cavity 130 is w1+w2, i.e. t1+w2 as t1≈w1. Consequently, a CMUT device is obtained with improved membrane robustness during the cavity release step as g<<t and t<<w at the stage of removal of the sacrificial material to form the cavity 130. Moreover, because the second dielectric layer 124 is formed, e.g. deposited, prior to the release of the cavity 130, a membrane with improved flatness characteristics is obtained as the presence of the sacrificial material prevents deformation of the first dielectric layer 120 during the formation of the second dielectric layer 124.

The CMUT device further comprises a ring 136 of the further dielectric material layer 132 over the second portion 24, which ring delimits the first portion 22. It has been found that the presence of such a rim or ring structure, which may be shaped like a pointed ear such as a rabbit ear or the like, further improves the robustness of the membrane during the cavity release step. In the context of the present application, it should be understood that robustness is used to describe the ability of the membrane to withstand the out-of-plane deformation 'h' as shown in FIG. 2.

Figure 5:
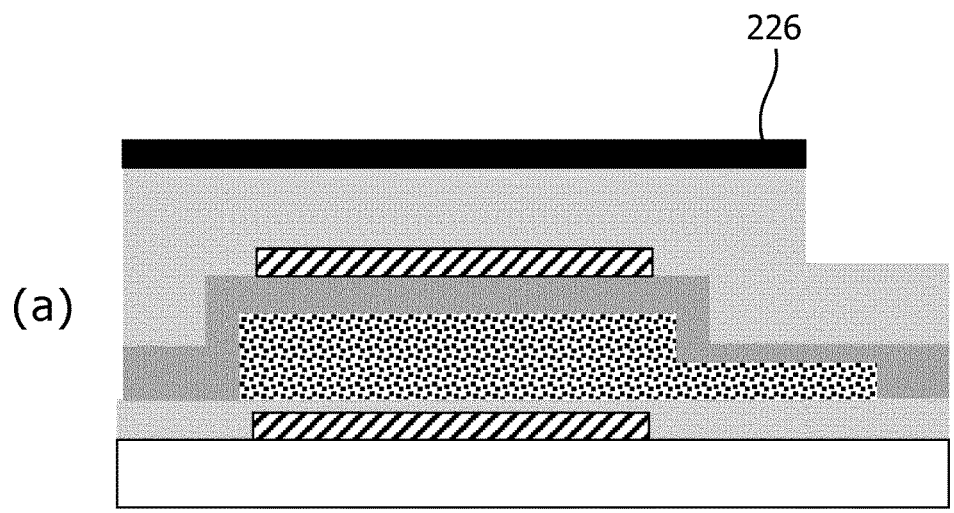
FIG. 5 schematically depicts key processing steps for manufacturing a CMUT device in accordance with another embodiment of the present invention.
Figure 5:
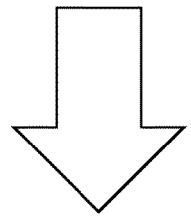
Figure 5:
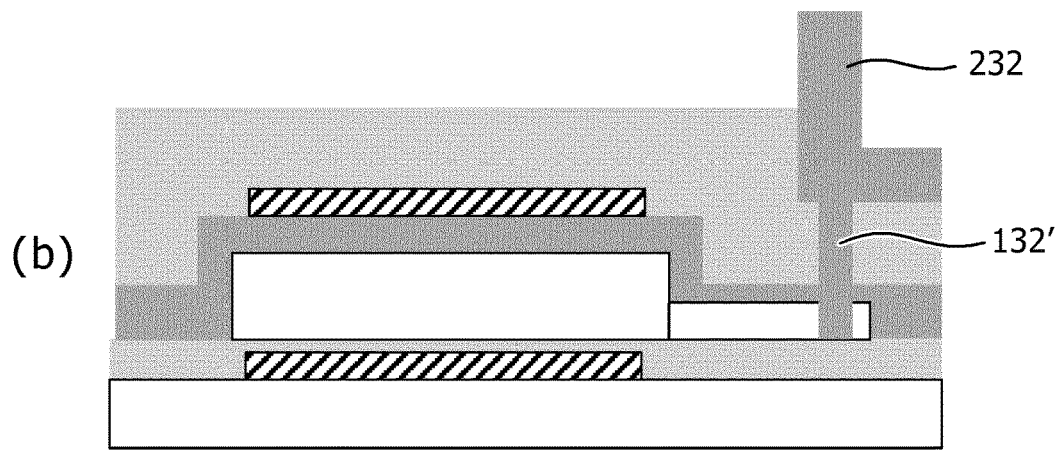

However, such a ring 136 may be omitted from the CMUT device design in alternative embodiments. One such embodiment is shown in FIG. 5, which shows selected alternative steps to the manufacturing method shown in FIG. 4 and described above. Step (a) in FIG. 5 replaces step (g) in FIG. 4 and step (b) in FIG. 5 replaces step (k) in FIG. 4. The other steps shown in FIG. 4 also form part of the process flow depicted in FIG. 5, and are not explicitly included in FIG. 5 for the sake of brevity only.

In step (a), the etch stop layer 226 is dimensioned such that it covers the first portion 22 and the second portion 24 of the second dielectric layer 124. This has the consequence that in the subsequent steps, in particular the selective removal of the further dielectric material layer 132 formed in step (j) of FIG. 4, a CMUT device results in which the thickness of the second portion 24 is not (significantly) increased compared to the thickness of the first portion 22, i.e. t~w in this embodiment. This is because the further dielectric material layer 132 is removed over a wider area of the second dielectric layer 124, as will be apparent from the larger etch stop layer 226, which is to protect a larger area of the underlying second dielectric layer 124 against the etch recipe to remove the selected portions of the further dielectric material layer 132.

Instead, as shown in step (b) of FIG. 5, the resultant CMUT device comprises a sealing plug 132' in the access or via 128 as well as a portion 232 of the further dielectric material layer 132 extending upwardly from this sealing plug. The combination of the sealing plug 132' and the portion 232 can be compared to a pin pushed into the access or via 128, wherein the portion 232 forms the head of the pin. As can be understood from analytic equation (1), the CMUT device shown in FIG. 5(b) still exhibits improved membrane robustness during the cavity release step as g<<t at the stage of removal of the sacrificial material to form the cavity 130. Moreover, because the second dielectric layer 124 is formed, e.g. deposited, prior to the release of the cavity 130, a membrane with improved flatness characteristics is obtained as the presence of the sacrificial material prevents deformation of the first dielectric layer 120 during the formation of the second dielectric layer 124.

In an embodiment, the further dielectric layer 132 may be replaced by a metal sealing layer such as an Al sealing layer. This improves the vacuum in the cavity 130 as metals are typically deposited using high vacuum deposition techniques in contrast to the deposition of dielectric materials such as silicon nitride, which are deposited in a gaseous phase and leave a higher residual pressure in the cavity 130. Hence, the sealing plug 132' and the portion 232 may be made of a suitable metal such as aluminium or metal alloy, e.g. an Al-based alloy.

Figure 6:
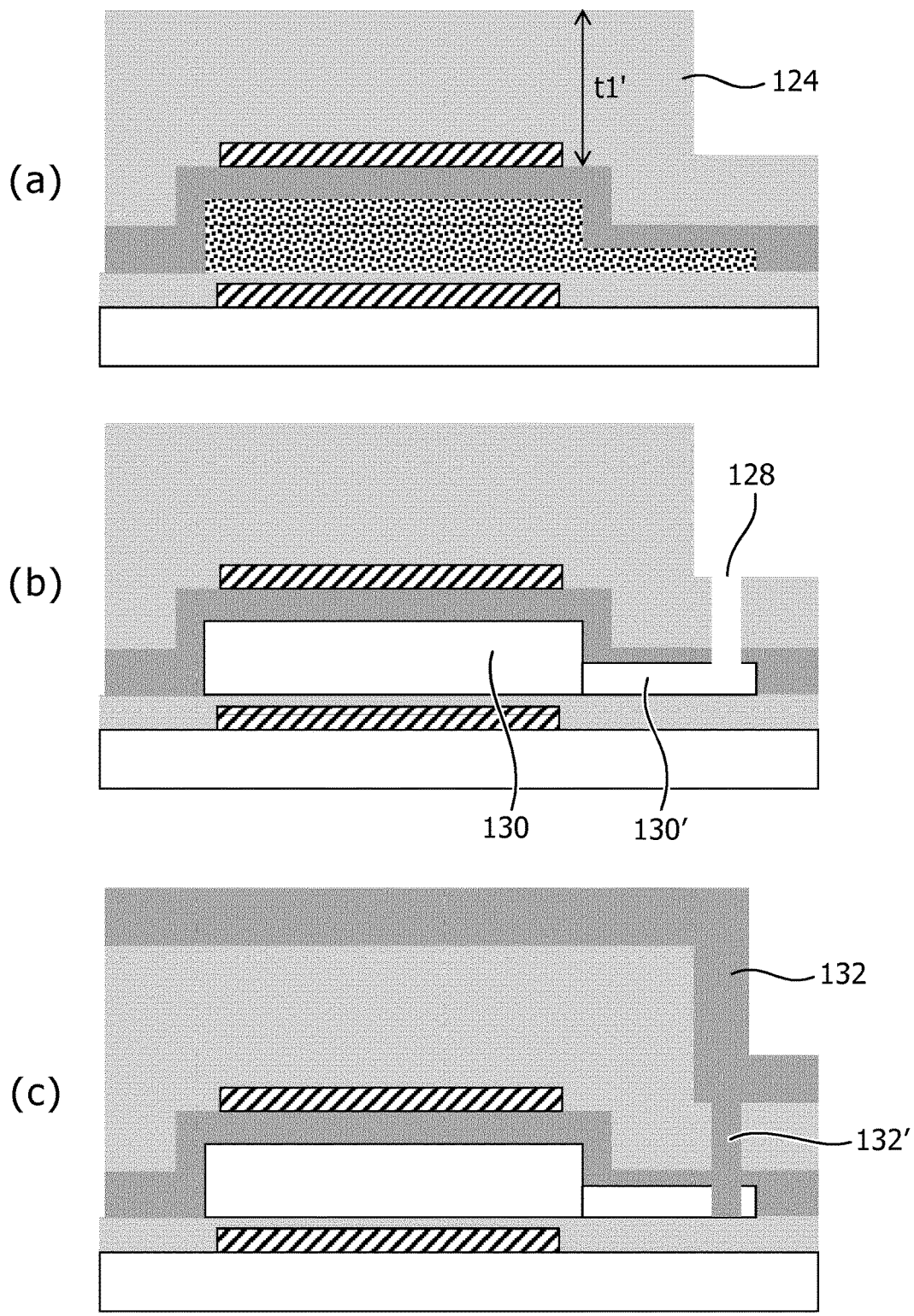
FIG. 6 schematically depicts key processing steps for manufacturing a CMUT device in accordance with yet another embodiment of the present invention.

Another embodiment of a method of manufacturing a CMUT device having a ratio g/t<<1 at the point of release of the cavity 130 is shown in FIG. 6. The starting point of FIG. 6 is the intermediate structure obtained after steps (a)-(e) of FIG. 4, i.e. steps (a)-(e) as shown in FIG. 4 also form part of the manufacturing method shown in FIG. 6 and are not explicitly shown in FIG. 6 for the sake of brevity only.

After the formation of the second electrode 122, the method proceeds as shown in step (a) of FIG. 6, in which the second dielectric layer 124 is formed to a first thickness t1', which exceeds the thickness of the first portion 116 of the sacrificial material in between the first electrode 112 and the second electrode 122 such that upon formation of the cavity 130 the height of the cavity gap g is substantially smaller than the thickness t1', i.e. g/t1'<<1. Preferably t1'≥5 g. This ensures that during the release of the cavity 130 in step (b), i.e. by formation of the access or via 128 and the subsequent removal of the first portion 116 and the second portion 116' of the sacrificial material as described in more detail in steps (h) and (i) of FIG. 4, the membrane still exhibits improved membrane robustness during the cavity release step as g<<t1' at the stage of removal of the sacrificial material to form the cavity 130. Moreover, because the second dielectric layer 124 is formed, e.g. deposited, prior to the release of the cavity 130, a membrane with improved flatness characteristics is obtained as the presence of the sacrificial material prevents deformation of the first dielectric layer 120 during the formation of the second dielectric layer 124.

In contrast to the methods shown in FIGS. 4 and 5, no etch stop layer is formed on the second dielectric layer 124. Instead, the thickness of the membrane is further increased during the sealing of the access or via 128 in step (c) by the formation of the further dielectric layer 132 including the plug 132' in the access or via 128 as described in more detail with the aid of step (j) in FIG. 4. In an embodiment, the further dielectric layer 132 is substantially thinner than the second dielectric layer 124. As before, the further dielectric layer 132 is formed to a thickness of at least twice the height of the cavity 130 to effectively seal the access or via 128. This again yields a CMUT device is which t and w as shown in FIG. 1 are approximately equal, as the second dielectric layer 124 and the further dielectric layer 132 are typically formed conformally.

At this point it is noted the CMUT devices formed in accordance with the embodiments of FIG. 4-6 respectively preferably have the same final membrane thickness to ensure that the devices exhibit the same or similar acoustic properties. Consequently, the second dielectric layer 124 is typically formed to a larger thickness in the embodiments of FIGS. 4 and 5 compared to the embodiment of FIG. 6 as the sealing layer or further dielectric layer 132 does not add to the final thickness of at least the first portion 22 of the membrane over the cavity 130, contrary to the embodiment shown in FIG. 6.

The above embodiments have demonstrated to be able to produce relatively large CMUT devices, e.g. CMUT devices having a cavity radius of 50 μm or more, in particular of 100 μm or more, e.g. up to 500 or even 1,000 μm, e.g. devices having a cavity radius in the range of 20-500 μm, 30-500 μm or 30-300 μm in high yields, as excessive deformation of the CMUT membranes especially at the periphery of the wafers has been avoided by the application of the thick second dielectric layer 124 over the second electrode 122 prior to the formation of the cavity 130.

At this point it is noted that the CMUT device according to embodiments of the present invention, which may be ring-shaped, can be readily distinguished from prior art devices in which the second dielectric layer 124 is formed after the formation of the cavity 130, as is for instance the case in US 2013/0069480 A1, see in particular FIG. 4A-F of this prior art citation. This is because the removal of the sacrificial material to form the cavity 130 will cause a residual contamination to form on the exposed upper surface of the membrane, which in the case of the CMUT device of US 2013/0069480 A1 will cause the presence of such a contamination on the first membrane 35.

In contrast, in the CMUT device of FIG. 4(k), FIG. 5(b) and FIG. 6(c), such contaminations are present on the exposed portions of the second dielectric material layer 124, such that the locations of such contaminations will be indicative of the fact that the second dielectric material layer 124 of the membrane will have been present over the second electrode during the removal of the sacrificial material to form the cavity 130. In other words, the absence of such a contamination in the lower regions of the membrane, i.e. on the first dielectric layer 120 or within a region of the membrane that faces the cavity 130 and has a thickness equal to the gap height g of the cavity 130, indicates that the CMUT device is obtained in accordance with an embodiment of the inventive manufacturing method.

It is noted that such contaminations can be detected using tunnelling electron microscopic (TEM) imaging even when the respective dielectric materials of the membrane are the same material, e.g. silicon nitride, as the contamination will show up as a clear delineation between subsequently deposited layers of the same material.

Figure 7:
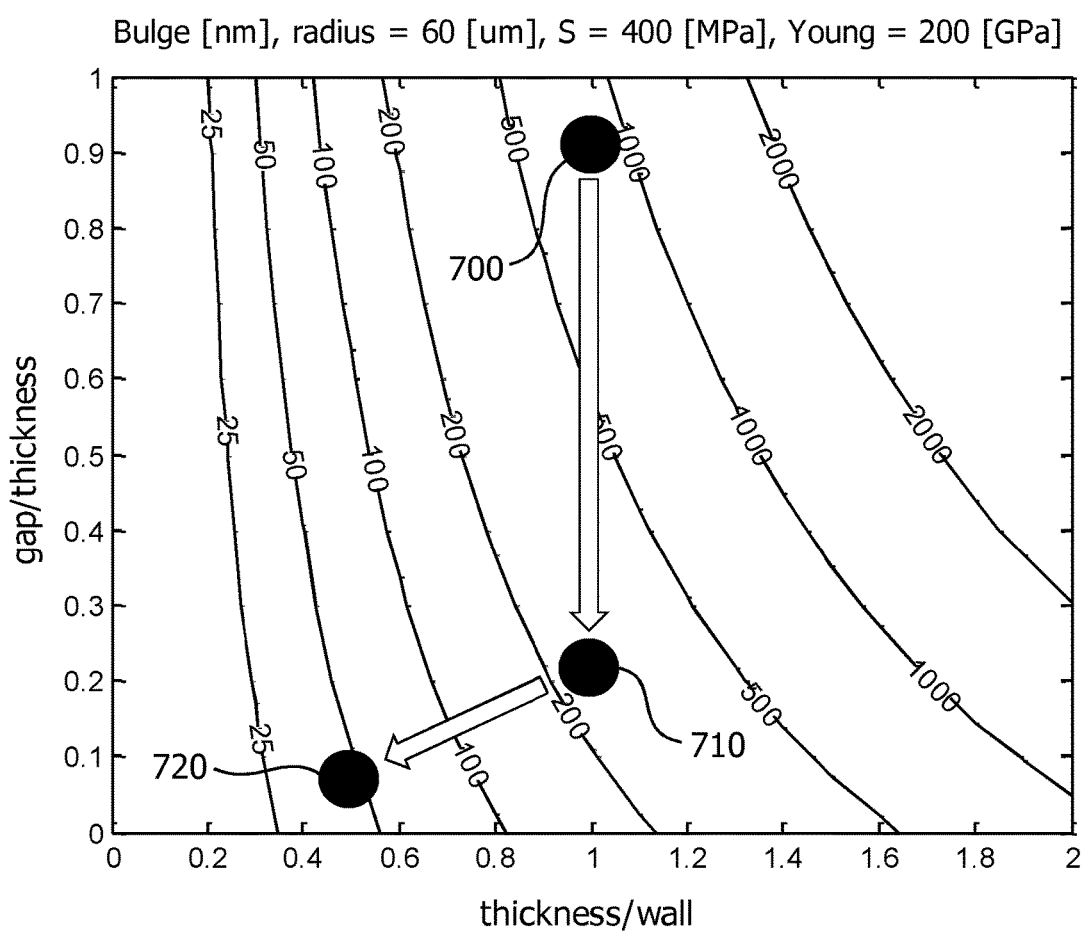
FIG. 7 shows the stress sensitivity of the prior art CMUT device of FIG. 1 as well as of CMUT devices according to embodiments of the present invention in a stress sensitivity plot.

The concept of the embodiments of FIG. 4-6 is further explained with the aid of FIG. 7, which again depicts the deformation plot for the first membrane portion 22 as a function of the ratio t/w (x-axis) and g/t (y-axis) as shown in FIG. 3. The depicted deformation characteristics are modelled using analytical equation 1. The deformation characteristics of the prior art CMUT device are labeled 700. A first improvement in these characteristics is obtained by the reduction of the g/t ratio for the CMUT devices manufactured in accordance with the methods depicted in FIG. 5 and FIG. 6, which characteristics are labeled 710. A further improvement of these characteristics is obtained by the reduction of the g/t ratio as well as the t/w ratio for the CMUT devices manufactured in accordance with the method depicted in FIG. 4, which characteristics are labeled 720.

Figure 8:
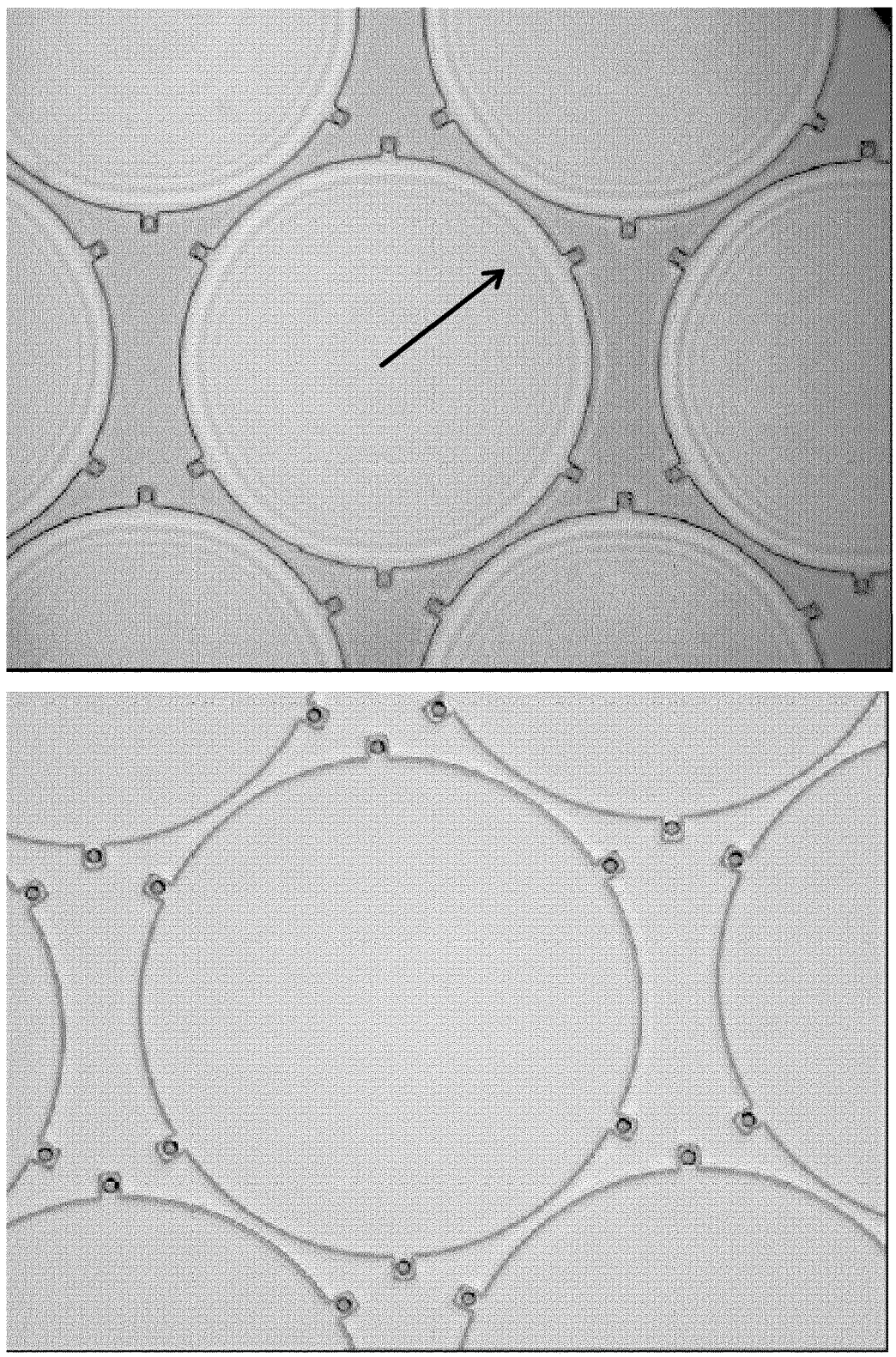
FIG. 8 shows optical microscope images of a part of a prior art wafer (top pane) and a part of a wafer manufactured in accordance with an embodiment of the present invention (bottom pane)

FIG. 8 shows images obtained using an optical microscope of a wafer comprising a plurality of circular CMUT devices without the presence of the thick second dielectric layer 124 on the second electrode (top image) and with the presence of the thick second dielectric layer 124 on the second electrode (bottom image) obtained by the method shown in FIG. 6. The arrow in the top pane identifies optical rings in the membranes of the prior art CMUT devices, which is indicative of considerable membrane deformation. The absence of the optical rings in the bottom image demonstrates the improved robustness of the membranes of the CMUT devices according to embodiments against such deformations.

Figure 9:
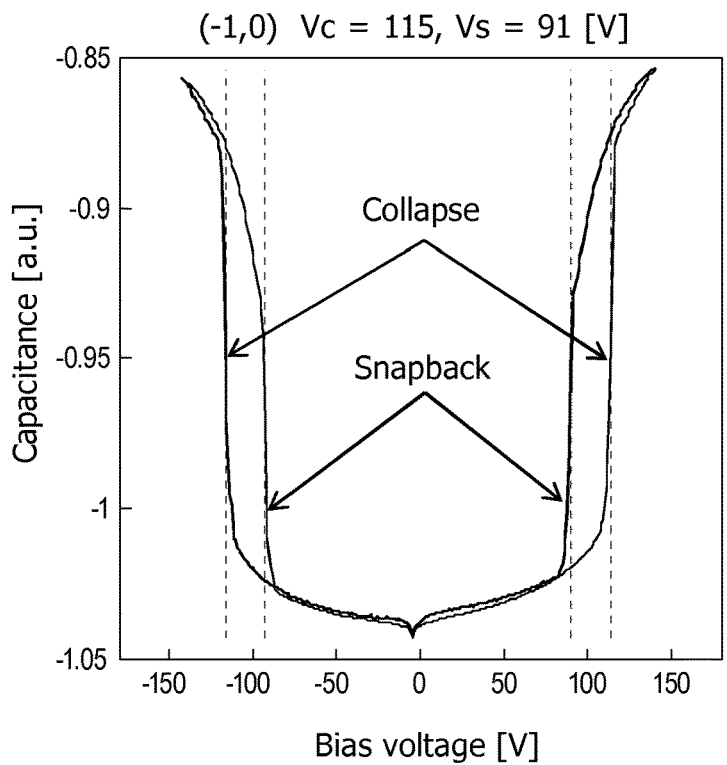
FIG. 9 shows a typical capacitance-voltage curve of a CMUT device.

FIG. 9 depicts a typical capacitance-voltage (CV) curve of a CMUT device. Upon the application of an increasing bias voltage across the first electrode 112 and the second electrode 122, at a critical voltage the electrical forces will cause the membrane to collapse towards the first electrode 112. This voltage is also known as the collapse voltage. Upon lowering the voltage from the collapse voltage, the membrane will snap back into its original position at the snapback voltage. CMUT devices may be operated in the collapse mode, i.e. in a mode in which the membrane is in its collapsed state. To this end, a bias voltage in excess of the collapse voltage may be permanently applied to the first electrode 112 and the second electrode 122.

The amount of membrane deformation h as shown in FIG. 2 has a marked influence on the magnitude of the collapse voltage, as well as on the acoustic properties of the CMUT device. Therefore, a mapping of the collapse voltages of the CMUT devices across a wafer provides a good indication of the stress-insensitivity of the CMUT devices during cavity formation, as the distribution of the collapse voltages across the wafer should demonstrate little variation in case of such a stress-insensitivity.

Figure 10:
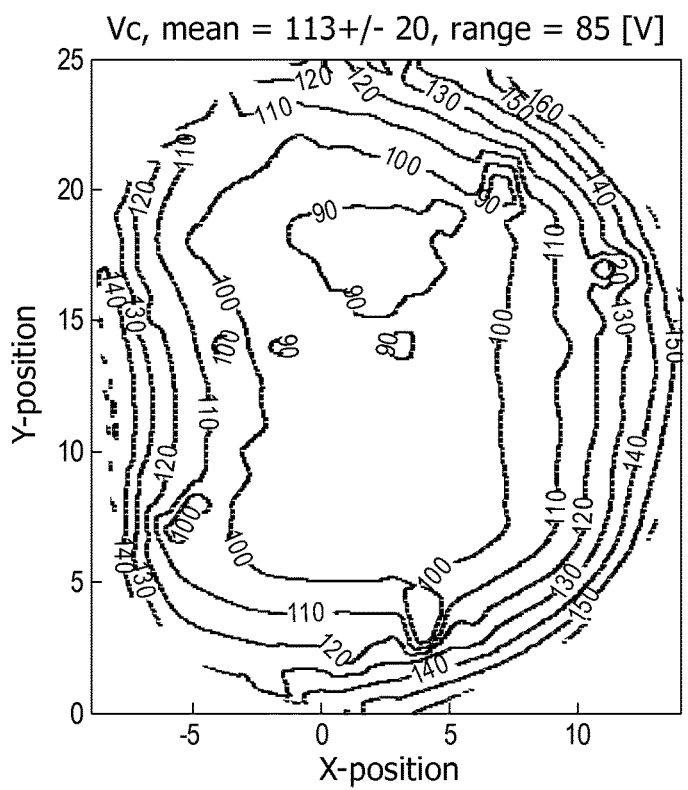
FIG. 10 shows a plot of the collapse voltage characteristics of prior art CMUT devices as a function of their wafer position.

FIG. 10 depicts a contour plot of the collapse voltage Vc across the wafer in the top image of FIG. 8, in which the respective cavities 130 were formed in the CMUT devices across the wafer in the absence of a second dielectric layer 124 of sufficient thickness. In the centre of the wafer, a typical value of Vc of around 90V is obtained whereas at the periphery of the wafer, this voltage increases to 150V or more, i.e. this wafer exhibits a variation in the collapse voltage Vc of the CMUT devices across the wafer in excess of 65%. This is a clear indication of the out-of plane bending of the membranes as shown in FIG. 2 in the wafer periphery, where higher bias voltages are required to reverse this deformation and force the membrane into collapse mode.

Figure 11:
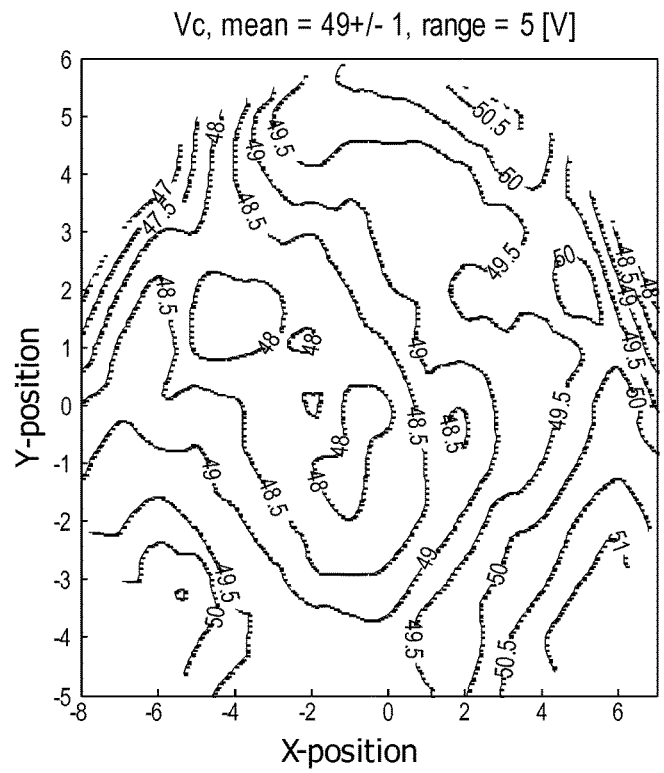
FIG. 11 shows plots of the collapse voltage characteristics of CMUT devices according to embodiments of the present invention as a function of their wafer position.
Figure 11:
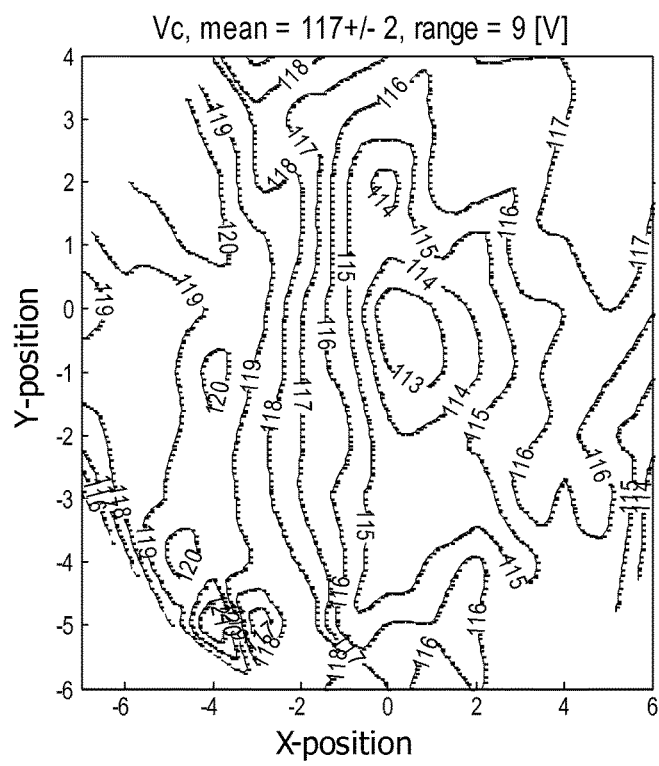

FIG. 11 shows the contour plots of the collapse voltage Vc across two wafers manufactured in accordance with different embodiments of the present invention. The top contour plot shows a wafer manufactured in accordance with the method of FIG. 6 and the bottom contour plot shows a wafer manufactured in accordance with the method of FIG. 4. It will be apparent that very little variation (less than 7% variation) exists between the collapse voltage Vc of CMUT devices in the centre of the wafer and CMUT devices at the wafer periphery.

Figure 12:
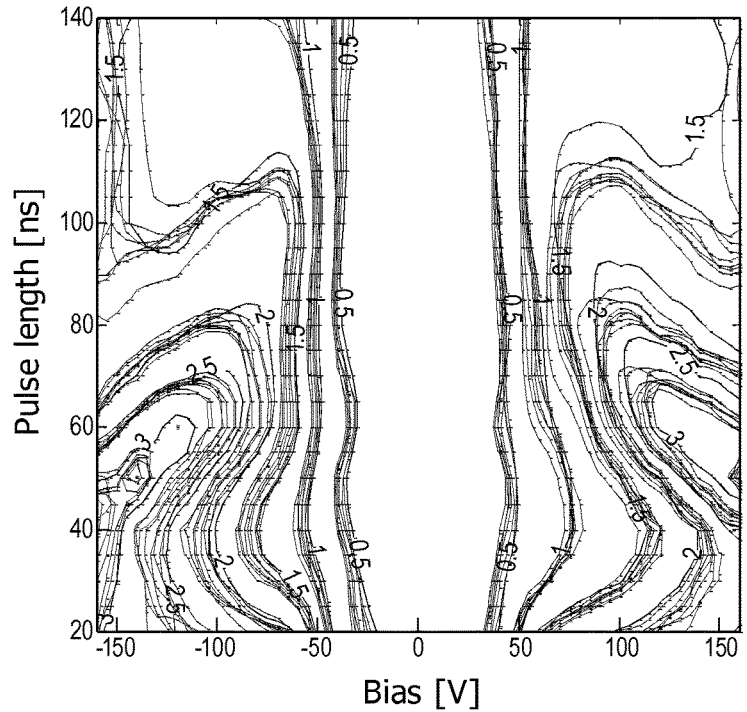
FIG. 12 shows plots of the acoustic performance of CMUT devices according to an embodiment of the present invention as a function of their wafer position.
Figure 12:
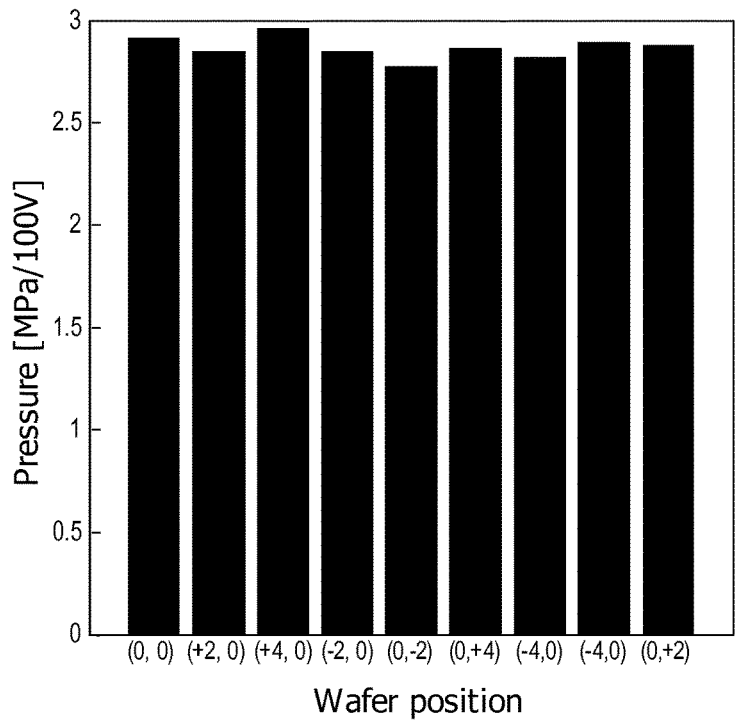

The left pane FIG. 12 shows a contour plot of the output pressures of a CMUT device arbitrarily selected from positions (−4,0) to (0, +4) (i.e. a linear array of nine CMUT devices including the CUT device in the centre of the wafer) on a wafer manufactured in accordance with the method of FIG. 6 (left hand pane). Output pressure is an important indicator of acoustic performance. The output pressures were generated by RF excitation of the CMUT device by varying the bias voltage from −150V to 150V (x-axis) and the pulse length from 20-140 ns (y-axis). The right hand pane shows the histogram of the output pressures of each of these devices as a function of their position on the wafer. For all devices in this array, near-identical contour plots were obtained with a variation of less than 2% in their output pressure, which is indicative of the excellent uniformity in acoustical performance of the (circular) CMUT devices on the wafers manufactured in accordance with embodiments of the present invention.

At this point it is noted that although not shown in the various embodiments, it should be understood that the CMUT devices according to devices on the wafers manufactured in accordance with embodiments may comprise additional circuit elements, which may be integrated on the substrate 110 or may be provided on a separate substrate and integrated into a single package with one or more of the CMUT devices from a wafer manufactured in accordance with embodiments of the present invention. Such additional circuitry may be instance be an IC, e.g. an ASIC, for controlling the one or more CMUT device and/or processing the signals generated by the one or more CMUT devices, e.g. to control transmission and/or reception modes of the one or more CMUT devices as previously explained.

One or more CMUT devices according to embodiments of the present invention may be advantageously incorporated into sensing apparatuses such as a pressure sensing apparatus and in particular in a medical imaging apparatus, e.g. an ultrasound imaging apparatus, where the integration of CMUT-based sensing elements can significantly improve the imaging resolution of the apparatus, which for instance improves the detectability of small size objects, e.g. anomalies such as tumours, in the body of a subject under investigation, e.g. a mammalian body such as a human body. In an embodiment, such an apparatus comprises a plurality of CMUT devices according to embodiments of the present invention arranged in a matrix, in which each CMUT device is individually addressable. Such an apparatus may for instance comprise several hundreds or thousands of such individually addressable CMUT devices.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A capacitive micro-machined ultrasonic transducer (CMUT) device comprising a first electrode on a substrate and a second electrode embedded in an electrically insulating membrane, the first electrode and the membrane being separated by a cavity, wherein the membrane comprises a single layer membrane portion on the second electrode and a further membrane portion extending from the single layer membrane portion towards the substrate alongside the cavity, wherein the single layer membrane portion and the further membrane portion each have a thickness exceeding a height of the cavity by at least a factor five.

2. The CMUT device of claim 1, wherein the single layer membrane portion and the further membrane portion each have a thickness exceeding the height of the cavity by at least a factor ten.

3. The CMUT device of claim 1, wherein the thickness of said further membrane portion exceeds the thickness of the single layer membrane portion.

4. The CMUT device of claim 3, further comprising a ring of an electrically insulating material on the further membrane portion, wherein said single layer membrane portion is at least partially exposed inside said ring.

5. The CMUT device of claim 1, further comprising a protrusion of a sealing material extending from the cavity.

6. The CMUT device of claim 5, wherein the sealing material is a metal such as aluminium or a metal alloy such as an aluminium-based alloy.

7. An apparatus comprising the CMUT device of claim 1.

8. The CMUT device of claim 1, wherein the cavity comprises a first circular portion and a plurality of protrusions extending outward from the first circular portion.

9. The CMUT device of claim 8, wherein a height of each of the plurality of protrusions is less than a height of the first circular portion.

10. The CMUT device of claim 5, wherein the protrusion of the sealing material comprises a sealing plug formed within an access that extends through the membrane into the cavity.

11. The CMUT device of claim 10, wherein the cavity comprises a first circular portion and a plurality of protrusions extending outward from the first circular portion, wherein the access extends through the membrane into at least one of the protrusions.

12. The CMUT device of claim 1, further comprising a ring of an electrically insulating material on the further membrane portion, wherein said single layer membrane portion is at least partially exposed inside said ring.

13. The CMUT device of claim 1, further comprising a dielectric layer deposited over the first electrode and the substrate.

14. The CMUT device of claim 13, wherein a portion of the further membrane portion contacts the dielectric layer.

* * * * *